(12) United States Patent
Terada et al.

(10) Patent No.: US 10,145,885 B2
(45) Date of Patent: Dec. 4, 2018

(54) ELECTRICAL LEAKAGE DETECTION APPARATUS

(71) Applicant: FUJITSU TEN LIMITED, Kobe-shi, Hyogo (JP)

(72) Inventors: Yohei Terada, Kobe (JP); Yasuyuki Hirose, Kobe (JP)

(73) Assignee: FUJITSU TEN LIMITED, Kobe-shi (JP)

( * ) Notice: Subject to any disclaimer, the term of this patent is extended or adjusted under 35 U.S.C. 154(b) by 0 days.

(21) Appl. No.: 15/480,424

(22) Filed: Apr. 6, 2017

(65) Prior Publication Data

US 2018/0017609 A1 Jan. 18, 2018

(30) Foreign Application Priority Data

Jul. 13, 2016 (JP) .................... 2016-138492

(51) Int. Cl.
| | |
|---|---|
| *G01R 31/02* | (2006.01) |
| *G01R 31/36* | (2006.01) |
| *H01H 47/00* | (2006.01) |
| *H02H 1/00* | (2006.01) |
| *H02H 3/04* | (2006.01) |

(52) U.S. Cl.
CPC ....... *G01R 31/025* (2013.01); *G01R 31/3648* (2013.01); *H01H 47/002* (2013.01); *H02H 1/0007* (2013.01); *H02H 3/04* (2013.01)

(58) Field of Classification Search
USPC .................... 702/63, 64, 182–185
See application file for complete search history.

(56) References Cited

U.S. PATENT DOCUMENTS 8,729,597 B2 * 5/2014 Kim ................ B82Y 10/00
 257/102
9,356,320 B2 * 5/2016 Shih ................ H01M 10/0585

FOREIGN PATENT DOCUMENTS

| JP | H08-294225 A | 11/1996 |
|---|---|---|
| JP | 2010-239773 A | 10/2010 |
| JP | 2013-142658 A | 7/2013 |
| JP | 2013-243846 A | 12/2013 |
| JP | 2014-020914 A | 2/2014 |
| JP | 2014-098681 A | 5/2014 |
| JP | 2014-161173 A | 9/2014 |
| JP | 2016-024155 A | 2/2016 |

* cited by examiner

*Primary Examiner* — Edward Raymond
(74) *Attorney, Agent, or Firm* — Oliff PLC (57) ABSTRACT

An electrical leakage detection apparatus includes a microcomputer and a relay. The microcomputer is configured to perform an electrical leakage diagnosis to determine whether or not a direct-current leakage exists from a secondary battery that provides and receives electricity to/from an alternating-current power system that includes an electrical leakage detector that detects an alternating-current leakage of alternating-current power supplied from a utility power source. The relay disconnectably connects the secondary battery with the microcomputer.

12 Claims, 9 Drawing Sheets

ELECTRICAL LEAKAGE DETECTION APPARATUS

BACKGROUND OF THE INVENTION

Field of the Invention

The invention relates to a technology that detects an electrical leakage.

Description of the Background Art

Conventionally, there has been a home energy distribution system that includes an alternating-current power system and a direct-current power system. The alternating-current power system supplies alternating-current power supplied from a business power source to a plurality of electric products and devices at home, and the direct-current power system stores direct current generated by a solar power generation apparatus or the like and supplies the generated power to the alternating-current power system after converting the generated direct current into alternating current according to a situation.

Such an energy distribution system includes a secondary battery that stores the generated direct-current power. If an electricity leakage occurs from the secondary battery, in a case where a user, a maintenance worker, etc. comes in contact with the secondary battery, the person may get an electric shock. It is possible to prevent the electrical shock due to the electrical leakage from the secondary battery if an electrical leakage detection apparatus is connected to the secondary battery.

However, in a case where the electrical leakage detection apparatus is connected to the secondary battery, a high voltage noise accidently entering from a direct-current power system due to some sort of reason may cause a problem.

SUMMARY OF THE INVENTION

According to one aspect of the invention, an electrical leakage detection apparatus includes: a microcomputer configured to perform an electrical leakage diagnosis to determine whether or not a direct-current leakage exists from a secondary battery that provides and receives electricity to/from an alternating-current power system that includes an electrical leakage detector that detects an alternating-current leakage of alternating-current power supplied from a utility power source; and a relay that disconnectably connects the secondary battery with the microcomputer.

Thus, it is possible to reduce occurrence of a problem caused by interference of a high voltage noise to the electrical leakage detection apparatus.

According to another aspect of the invention, the microcomputer causes the relay (i) to be in an ON-state in a case where the electrical leakage diagnosis is performed and (ii) to be in an OFF-state while the electrical leakage diagnosis is not performed, so that the relay disconnects the microcomputer from the secondary battery while the electrical leakage diagnosis is not performed.

Thus, it is possible to reduce occurrence of a problem caused by interference of a high voltage noise to the electrical leakage detection apparatus while the electrical leakage diagnosis is not performed.

Therefore, an object of the invention is to provide a technology that reduces a problem caused by interference of a high voltage noise.

These and other objects, features, aspects and advantages of the invention will become more apparent from the following detailed description of the invention when taken in conjunction with the accompanying drawings.

DESCRIPTION OF THE EMBODIMENTS

Figure 1:
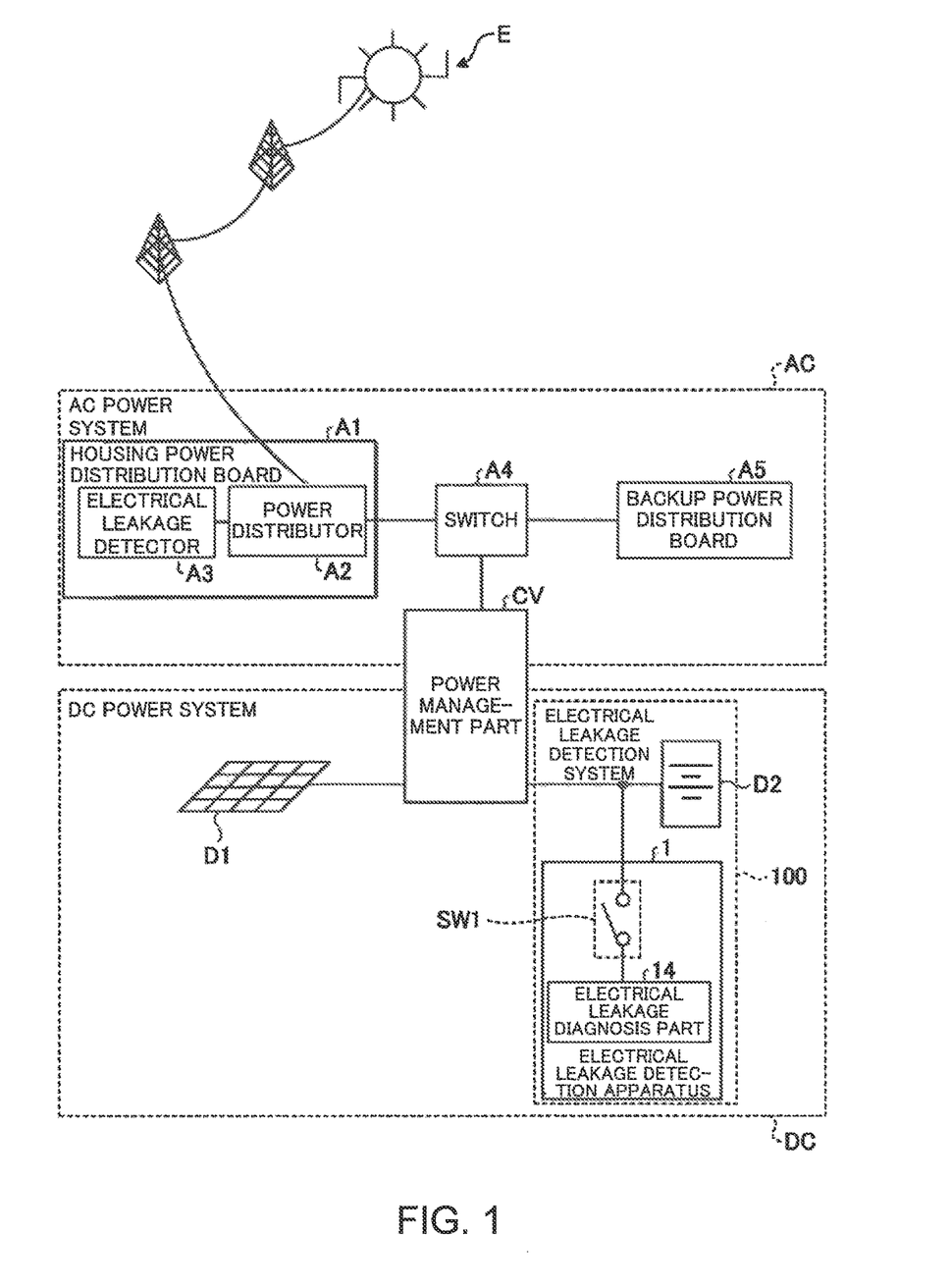
FIG. 1 illustrates an electrical power system of a house including an electrical leakage detection system of an embodiment.

With reference to the attached drawings, an electrical leakage detection apparatus and an electrical leakage detection system of an embodiment will be described in detail below. The invention is not limited by this embodiment. FIG. 1 illustrates an electrical power system of a house including an electrical leakage detection system 100 of the embodiment.

As shown in FIG. 1, the house of the embodiment includes an alternating-current (AC) power system AC and a direct-current (DC) power system DC. Further, the house of the embodiment includes a power management part CV that belongs to both of the AC power system AC and the DC power system DC.

The AC power system AC includes a housing power distribution board A1, a switch A4 and a backup power distribution board A5. The housing power distribution board A1 includes a power distributor A2 and an electrical leakage detector A3. The power distributor A2, for example, distributes AC power supplied from a utility power source E, such as a power generation plant, to a plurality of electrical devices in the house. The electrical leakage detector A3 monitors an AC leakage from the AC power system AC, and in a case where the electrical leakage detector A3 has detected the AC leakage, the electrical leakage detector A3 turns off supply of the AC power to the plurality of electrical devices.

The switch A4 switches a power supply source for the backup power distribution board A5 between the housing power distribution board A1 and the power management part CV. The switch A4 functions to use the housing power distribution board A1 as the power supply source for the backup power distribution board A5 in a time period of non-power outage, and to use the power management part CV as the power supply source for the backup power distribution board A5 in a time period of power outage.

The backup power distribution board A5 distributes the AC power to one or more electrical devices that are used even during the power outage, among the electrical devices in the house. The backup power distribution board A5 distributes the AC power supplied from the housing power distribution board A1 to one or more electrical devices in the time period of the non-power outage and distributes the AC power supplied from the power management part CV to one or more electrical devices in the time period of the power outage.

The DC power system DC includes a solar power generation system D1 and the electrical leakage detection system 100. The solar power generation system D1 converts sunlight that the solar power generation system D1 receives into direct current, and then outputs the converted direct current to the power management part CV. The DC power system DC may further include another direct-current power generation system, for example, a housing gas generation system. In a case of such a configuration, the another power generation system outputs the generated direct current to the power management part CV.

The electrical leakage detection system 100 includes a secondary battery D2 and an electrical leakage detection apparatus 1. The secondary battery D2 is, for example, a lithium-ion battery. The secondary battery D2 stores electricity input from the solar power generation system D1 through the power management part CV. Moreover, the secondary battery D2 receives and provides electricity from/to the AC power system AC through the power management part CV.

In the time period of the non-power outage, the power management part CV outputs, to the secondary battery D2, the DC power input from the solar power generation system D1. Then, the DC power is stored in the secondary battery D2. Moreover, in the time period of the power outage, the power management part CV converts the DC power supplied from the secondary battery D2 into the AC power, and then supplies the converted AC power to the backup power distribution board A5 through the switch A4. In a case where surplus power is stored in the secondary battery D2, the power management part CV performs a process that converts the surplus DC power into the AC power to sell the surplus power through the switch A4 and the housing power distribution board A1.

Moreover, the power management part CV converts relatively low-priced AC power supplied at night through the housing power distribution board A1 from the utility power source E, into the DC power, and then outputs the converted the DC power to the secondary battery D2. Then, the converted DC power is stored in the secondary battery D2. Moreover, the power management part CV can convert the DC power input from the secondary battery D2 daytime into the AC power to supply the AC power to the housing power distribution board A1 and the backup power distribution board A5 through the switch A4.

The electrical leakage detection apparatus 1 includes a relay SW1 and an electrical leakage diagnosis part 14. Other elements included in the electrical leakage detection apparatus 1 will be described later with reference to FIG. 2. The electrical leakage diagnosis part 14 diagnoses whether or not a DC leakage exists from the secondary battery D2.

The electrical leakage diagnosis part 14 automatically regularly performs electrical leakage detection in a relatively short time period, for example, in five minutes once a day. Moreover, the electrical leakage diagnosis part 14 performs an electrical leakage diagnosis in the short time period of five minutes when, for example, an operator or the like irregularly operates the electrical leakage detection apparatus 1 manually.

The relay SW1 disconnectably connects the secondary battery D2 to the electrical leakage diagnosis part 14. Thus, in a case where the electrical leakage detection apparatus 1 performs the electrical leakage diagnosis for the secondary battery D2, the electrical leakage detection apparatus 1 turns on the relay SW1 to connect the secondary battery D2 to the electrical leakage diagnosis part 14. Then, the electrical leakage detection apparatus 1 keeps the relay SW1 turned off while the electrical leakage diagnosis is not performed, in order to disconnect the connection between the secondary battery D2 and the electrical leakage diagnosis part 14.

A time period in which the electrical leakage diagnosis is not performed is far longer than a time period in which the electrical leakage diagnosis is performed. Since the electrical leakage detection apparatus 1 keeps the electrical leakage diagnosis part 14 disconnected from the secondary battery D2 in the longer time period in which the electrical leakage diagnosis is not performed, it is possible to reduce occurrence of a problem caused by interference of a high voltage noise that is accidentally generated in the DC power system DC.

Figure 2:
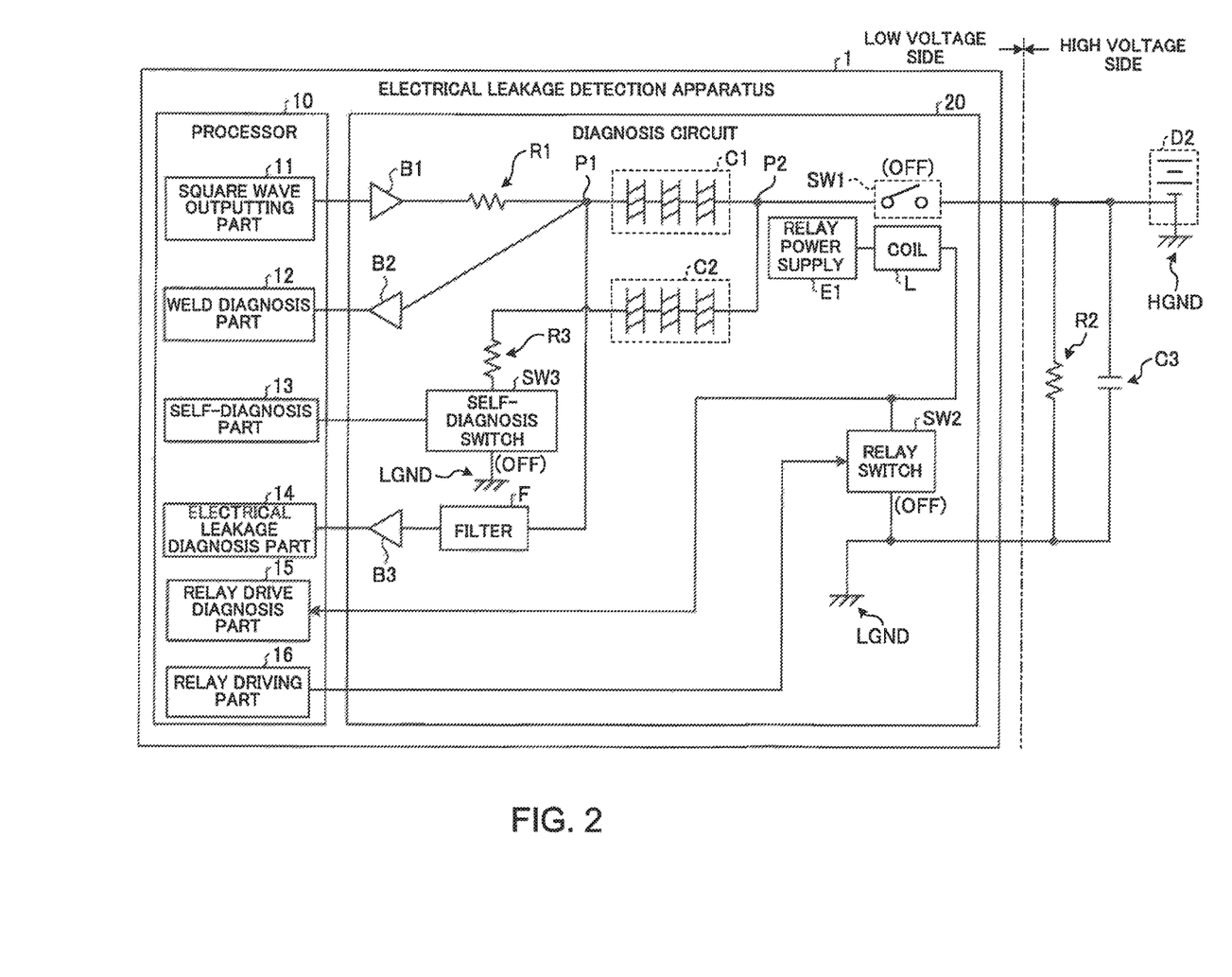
FIG. 2 illustrates a configuration of an electrical leakage detection apparatus of the embodiment.

Next, with reference to FIG. 2, a configuration of the electrical leakage detection apparatus 1 of the embodiment will be described. FIG. 2 illustrates the configuration of the electrical leakage detection apparatus 1 of the embodiment. As shown in FIG. 2, the electrical leakage detection apparatus 1 includes a processor 10 and a diagnosis circuit 20.

The processor 10 is a microcomputer that includes, for example, a central processing unit (CPU), a read only memory (ROM), a random access memory (RAM), an input/output port and various circuits.

The processor 10 includes a square wave outputting part 11, a weld diagnosis part 12, a self-diagnosis part 13, an electrical leakage diagnosis part 14, a relay drive diagnosis part 15 and a relay driving part 16. Functions of those parts are implemented by the CPU executing diagnosis programs stored in the ROM, using the RAM as a workspace.

The square wave outputting part 11, the weld diagnosis part 12, the self-diagnosis part 13, the electrical leakage diagnosis part 14, the relay drive diagnosis part 15 and the relay driving part 16 may be partially or entirely configured with hardware, such as an application specific integrated circuit (ASIC) or a field programmable gate array (FPGA).

When the weld diagnosis part 12 and the electrical leakage diagnosis part 14 perform diagnoses, the square wave outputting part 11 outputs a square wave to the diagnosis circuit 20. The weld diagnosis part 12 is a processor that performs a weld diagnosis to determine whether or not the relay SW1 is welded in an ON-state or in an OFF-state based on a voltage signal received from the diagnosis circuit 20 in response to the square wave output from the square wave outputting part 11.

When the electrical leakage detection apparatus 1 performs a self-diagnosis to determine whether or not an electrical leakage detection function works normally, the self-diagnosis part 13, a processor, forms, in the diagnosis circuit 20, a simulation circuit simulating a situation in which no electrical leakage exists from the secondary battery D2.

The electrical leakage diagnosis part 14 is a processor that performs the electrical leakage diagnosis to determine whether or not the DC leakage exists from the secondary battery D2, based on the voltage signal received from the diagnosis circuit 20 in response to the square wave output from the square wave outputting part 11.

In a case where the diagnoses are performed by the weld diagnosis part 12, the self-diagnosis part 13 and the electrical leakage diagnosis part 14, the relay driving part 16 causes the relay SW1 to be in the ON-state. On the other hand, in a case where the diagnoses are not performed, the relay driving part 16 causes the relay SW1 to be in the OFF-state. The relay drive diagnosis part 15 is a processor that performs a diagnosis for a relay driving circuit based on presence or absence of current input from a coil L in a case where the relay driving part 16 causes the relay SW1 to be in the ON-state. Detailed operations of the square wave outputting part 11, the weld diagnosis part 12, the self-diagnosis part 13, the electrical leakage diagnosis part 14, the relay drive diagnosis part 15 and the relay driving part 16 will be described later with reference to FIGS. 2 to 8.

The diagnosis circuit 20 includes a first buffer B1, a detection resistor R1, a first coupling capacitor C1 and the relay SW1 connected in series between the square wave outputting part 11 and a high-voltage side ground HGND that is a negative electrode of the secondary battery D2, in an order closer from the square wave outputting part 11. Moreover, the diagnosis circuit 20 includes a second buffer B2 connected in series between the weld diagnosis part 12 and a connection point (hereinafter referred to as "first connection point P1") connecting the detection resistor R1 to the first coupling capacitor C1.

Moreover, the diagnosis circuit 20 includes, between the self-diagnosis part 13 and a connection point (hereinafter referred to as "second connection point P2"), a second coupling capacitor C2, a simulation insulation resistor R3 and a self-diagnosis switch SW3 connected in series in an order closer from the second connection point P2 connecting the first coupling capacitor C1 and the relay SW1. Moreover, the diagnosis circuit 20 includes a filter F and a third buffer B3 connected in series between the first connection point P1 and the electrical leakage diagnosis part 14, in an order closer from the first connection point P1.

Moreover, the diagnosis circuit 20 includes a relay power source E1 as well as the coil L that is connected in series between the relay power source E1 and the relay drive diagnosis part 15. The diagnosis circuit 20 includes a relay switch SW2 connected in series between the coil L and a low-voltage side ground LGND that is a ground potential.

The first buffer B1, the second buffer B2 and the third buffer B3 are voltage follower circuits having high input impedance and low output impedance. The detection resistor R1 set at a predetermined resistance value is provided to divide a voltage of the square wave input from the square wave outputting part 11 with a ground insulation resistance R2 of the secondary battery D2.

The simulation insulation resistor R3 is set to a resistance value substantially equivalent to the ground insulation resistance R2 of the secondary battery D2 to be measured in a case where no DC leakage exists from the secondary battery D2. The first coupling capacitor C1 and the second coupling capacitor C2 are circuit elements that block the direct current.

The self-diagnosis switch SW3 is turned on by the self-diagnosis part 13 when the self-diagnosis part 13 performs the self-diagnosis. The self-diagnosis switch SW3 is, for example, a photocoupler. The filter F is a filter circuit configured by connecting a highpass filter, a lowpass filter and a bandpass filter in series, and removes noises from a voltage signal output from the first connection point P1.

The relay SW1 is a mechanical relay. The relay power source E1 is a power source for causing the relay SW1 to be in the ON-state from the OFF-state. The coil L causes the relay SW1 to be in the ON-state from the OFF-state by a magnetic field generated by a current flowing from the relay power source E1. The relay switch SW2 is switched between the ON-state and the OFF-state under control of the relay driving part 16. The relay switch SW2 in the ON-state causes the current to flow from the relay power source E1 to the coil L.

The drawing in FIG. 2 is divided into two by the dot-and-dash line, one of which is a low voltage side on which the electrical leakage detection apparatus 1 is located and the other is a high voltage side on which the secondary battery D2 is located. Moreover, a resistance between the high-voltage side ground HGND and the low-voltage side ground LGND is not a mounted resistor but is the ground insulation resistance R2 of the secondary battery D2. Moreover, a capacitor between the high-voltage side ground HGND and the low-voltage side ground LGND is not a mounted capacitor but is a stray capacitance C3.

Figure 3:
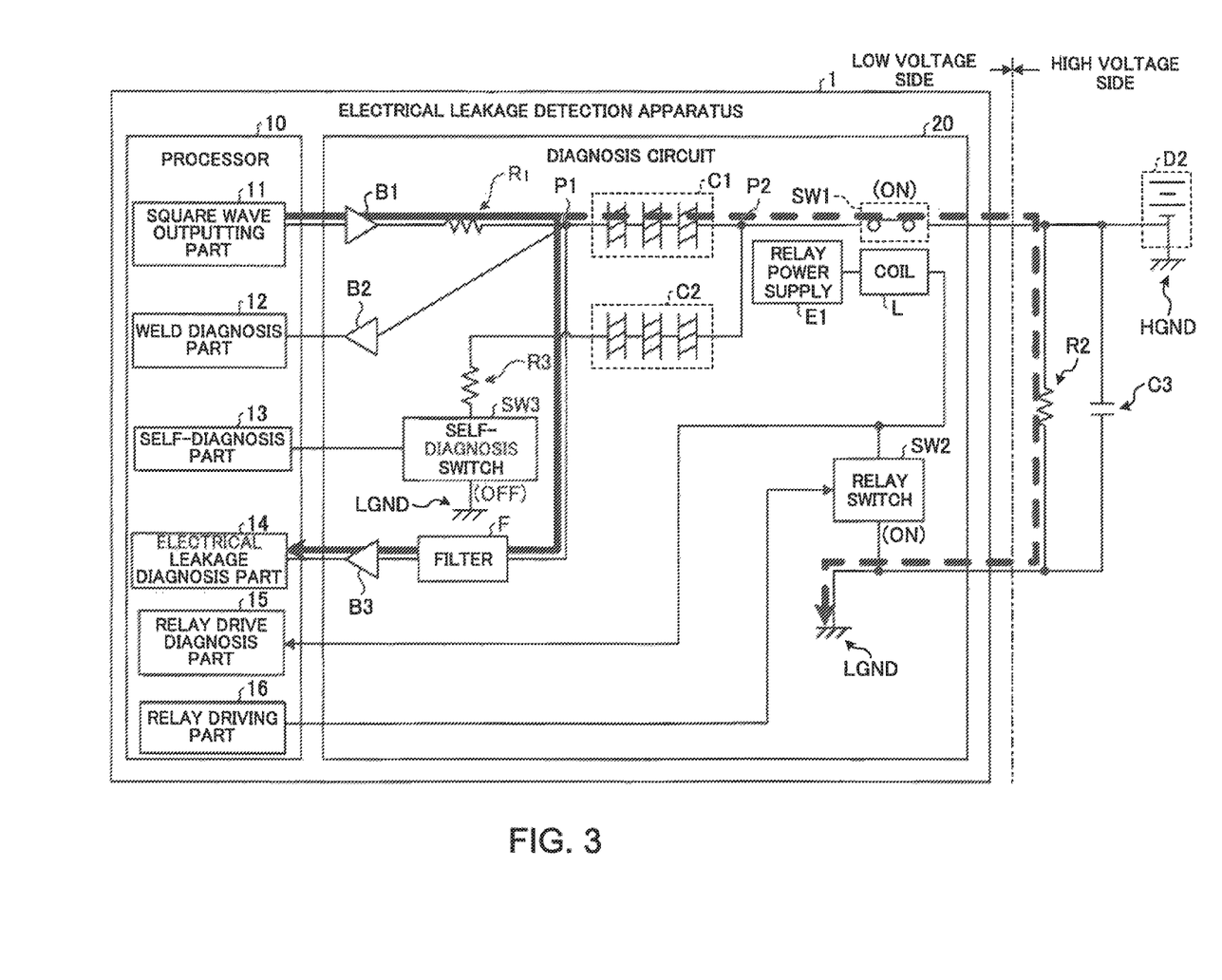
FIG. 3 illustrates an operation of the electrical leakage detection apparatus of the embodiment.
Figure 4:
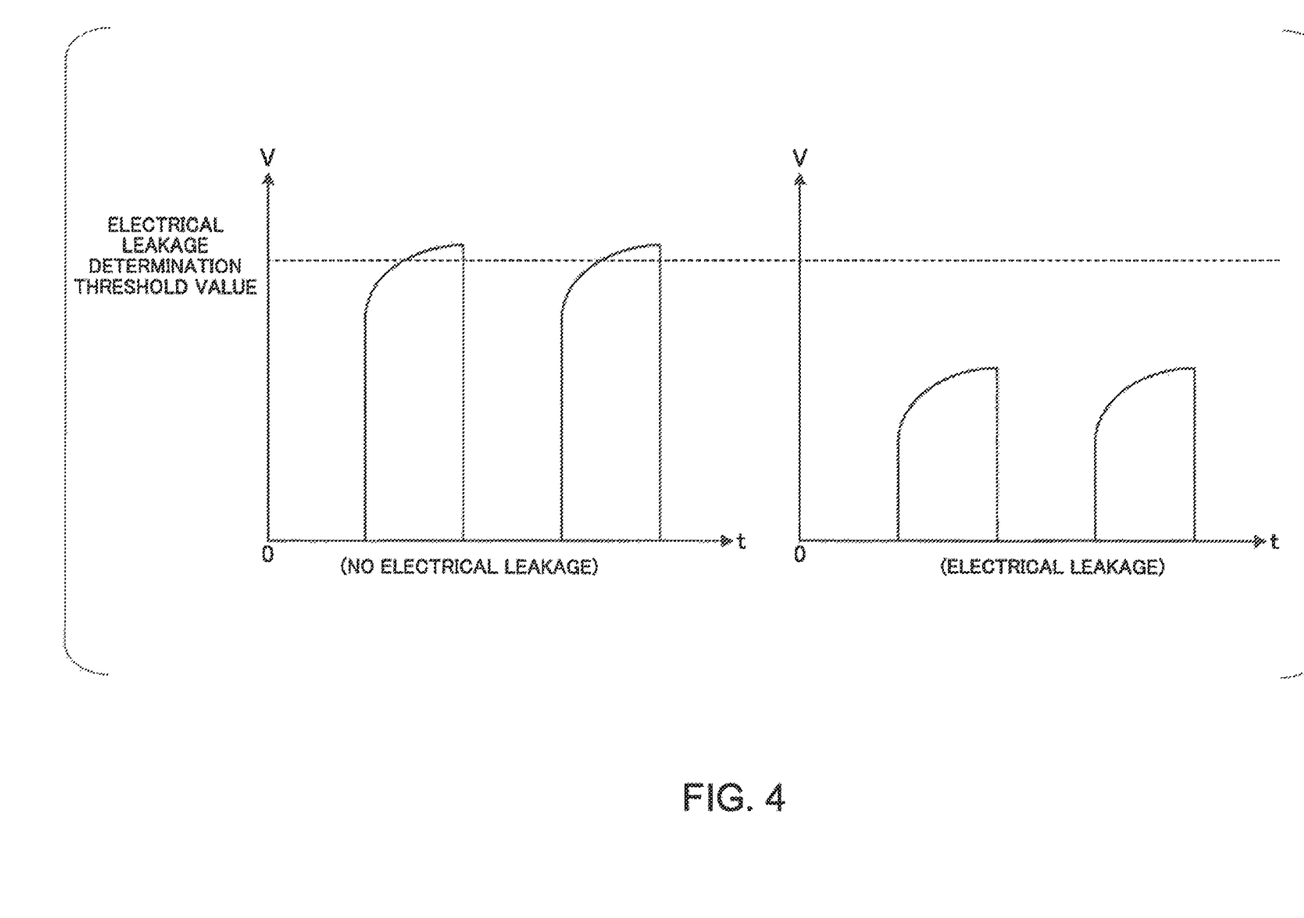
FIG. 4 illustrates an operation of the electrical leakage detection apparatus of the embodiment.

Operations of the electrical leakage detection apparatus 1 in FIG. 2 will be described below with reference to FIGS. 3 to 9. FIGS. 3 to 9 illustrate the operations of the electrical leakage detection apparatus 1 of the embodiment. With reference to FIGS. 3 to 4, first described will be an operation of the electrical leakage detection apparatus 1 to perform the electrical leakage diagnosis for the secondary battery D2.

FIG. 3 illustrates a flow of the voltage signal at the electrical leakage diagnosis. FIG. 4 illustrates waveforms of the voltage signals input to the electrical leakage diagnosis part 14 in a case where no electrical leakage exists from the secondary battery D2 and in a case where an electrical leakage exists from the secondary battery D2. A vertical axis and a horizontal axis of FIG. 4 represent voltage value and time, respectively.

As shown in FIG. 3, in the case where the electrical leakage detection apparatus 1 performs the electrical leakage diagnosis, the relay driving part 16 first causes the relay switch SW2 to be on to change the state of the relay SW1 from the OFF-state to the ON-state. Then, the square wave outputting part 11 outputs the square-wave voltage signal to the diagnosis circuit 20.

In the case where no electrical leakage exists from the secondary battery D2, the resistance value of the ground insulation resistance R2 is equal to infinite. Therefore, the voltage signal input to the diagnosis circuit 20 is input into the electrical leakage diagnosis part 14 through the first buffer B1, the detection resistor R1, the first connection point P1, the filter F and the third buffer B3, as shown by a heavy solid arrow line in FIG. 3. Noises are removed by the filter F from the voltage signal, and frequency components of the square wave are selectively extracted.

However, in the case where the electrical leakage exists from the secondary battery D2, a resistance value of the ground insulation resistance R2 decreases. Thus, in such a case, in addition to the voltage signal path shown by the heavy solid arrow line in FIG. 3, a voltage signal path reaching the low-voltage side ground LGND through the first connection point P1, the first coupling capacitor C1, the second connection point P2, the relay SW1 and the ground insulation resistance R2, is formed as shown by a heavy dotted arrow line in FIG. 3.

Thus, in the case where the electrical leakage exists from the secondary battery D2, a voltage value of the voltage signal at the first connection point P1 is lower as compared to the case where no electrical leakage exists, because the voltage is divided by the detection resistor R1 and the ground insulation resistance R2.

Then, the electrical leakage diagnosis part 14 determines and stores beforehand an electrical leakage determination threshold value, using a peak value of the voltage of the voltage signal expected to be input as a reference value in the case where no electrical leakage exists from the secondary battery D2. Then, the electrical leakage diagnosis part 14 diagnoses whether or not the electrical leakage exists from the secondary battery D2, based on the voltage value (peak-to-peak value) of the voltage signal received from the first connection point P1.

Specifically, the electrical leakage diagnosis part 14 samples the input voltage signal, and then detects the peak value of the voltage of the voltage signal. Then, the electrical leakage diagnosis part 14 compares the detected peak value with the electrical leakage determination threshold value stored beforehand.

In a case where the sampled peak value of the voltage signal is equal to or greater than the electrical leakage determination threshold value, as shown by a waveform indicated with "NO ELECTRICAL LEAKAGE" in FIG. 4, the electrical leakage diagnosis part 14 diagnoses that no electrical leakage exists. On the other hand, in a case where the sampled peak value of the voltage signal is smaller than the electrical leakage determination threshold value, as shown by a waveform indicated with "ELECTRICAL LEAKAGE" in FIG. 4, the electrical leakage diagnosis part 14 diagnoses that the electrical leakage exists.

Then, once the electrical leakage diagnosis part 14 ends the electrical leakage diagnosis, a noticing part, not illustrated, reports a diagnosis result. After that, the relay driving part 16 causes the relay SW1 to be in the OFF-state from the ON-state.

Thus, the electrical leakage detection apparatus 1 is disconnected from the relay SW1 in most time period except the relatively short time period in which the electrical leakage diagnosis is performed. Therefore, if using the electrical leakage detection apparatus 1, it is possible to reduce occurrence of a problem caused by interference of a high voltage noise that is accidentally generated in the DC power system DC.

Figure 5:
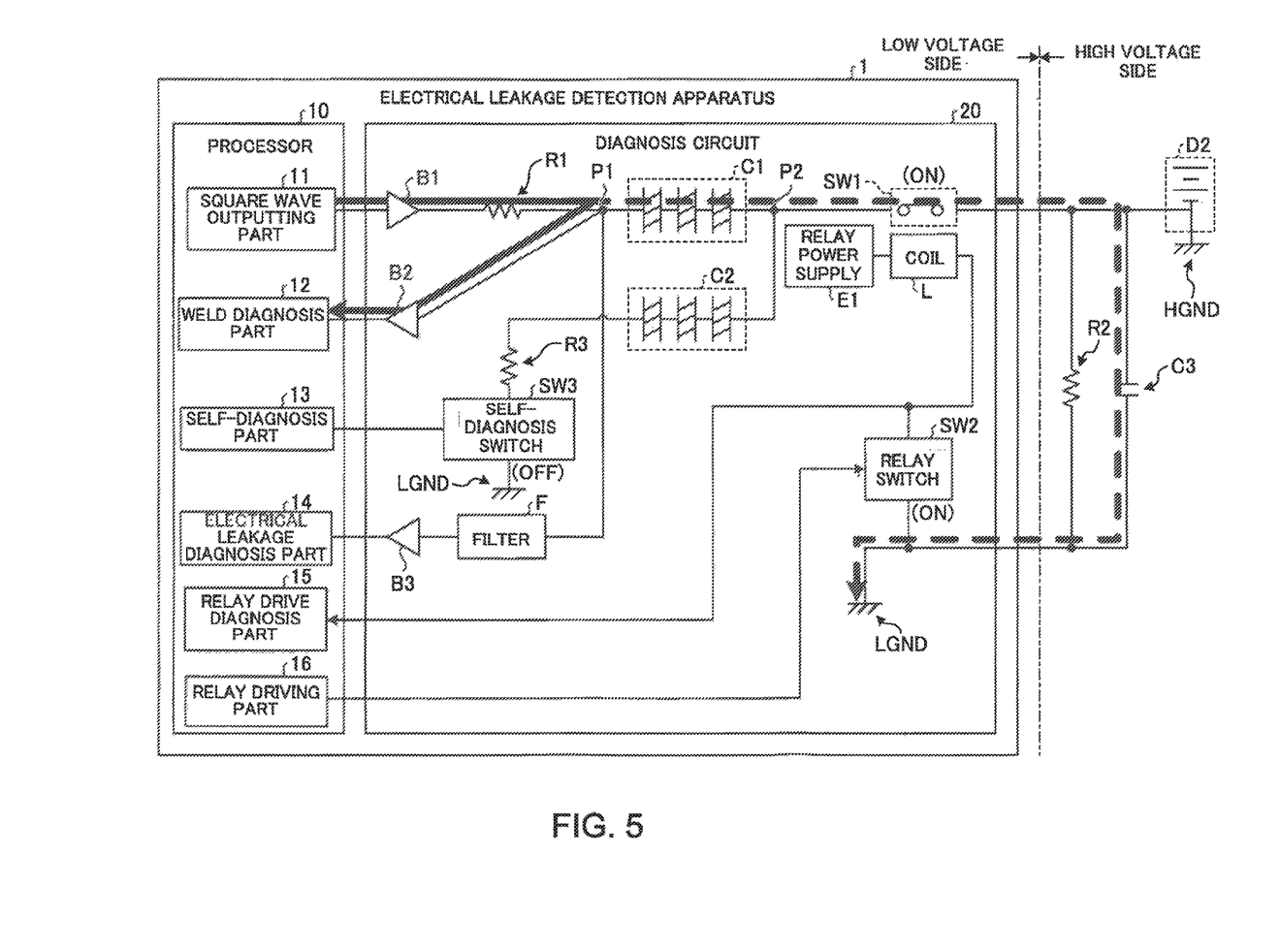
FIG. 5 illustrates an operation of the electrical leakage detection apparatus of the embodiment.
Figure 6:
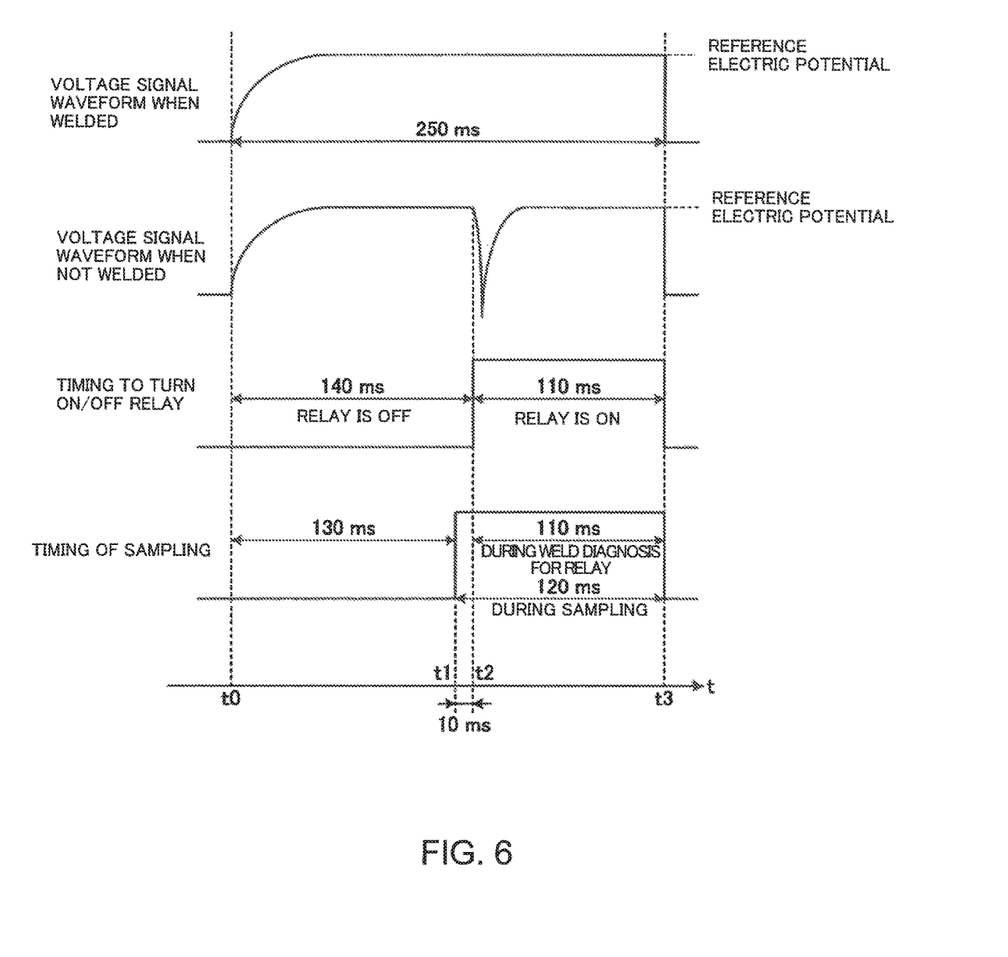
FIG. 6 illustrates an operation of the electrical leakage detection apparatus of the embodiment.
Figure 7:
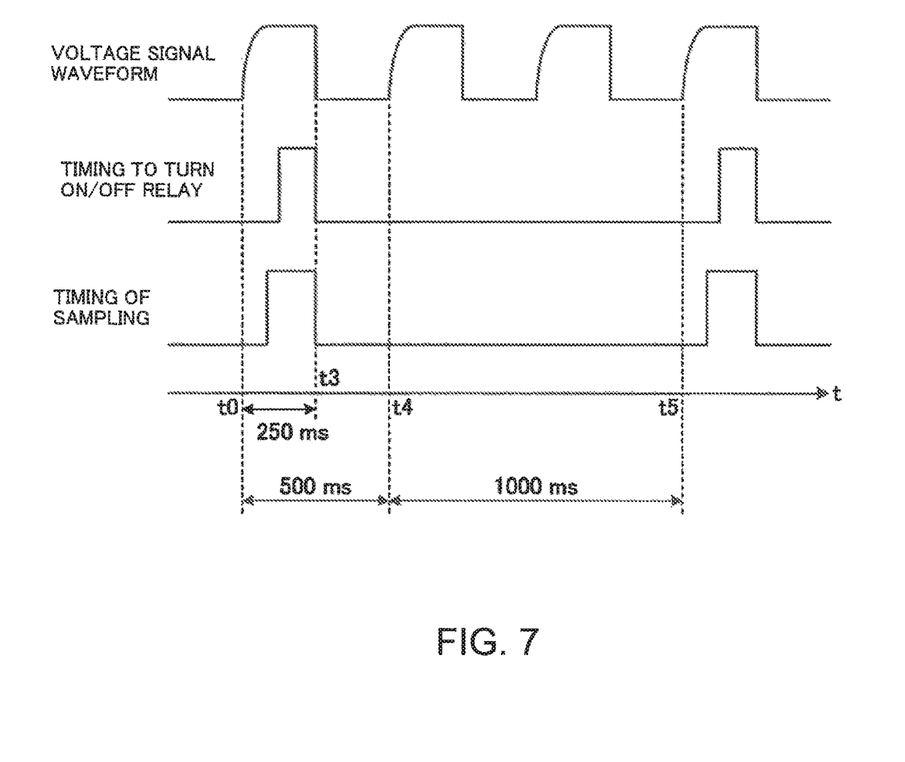
FIG. 7 illustrates an operation of the electrical leakage detection apparatus of the embodiment.

Next described will be an operation of the electrical leakage detection apparatus 1, with reference to FIGS. 5 to 7, to perform the weld diagnosis for the relay SW1. FIG. 5 illustrates a flow of the voltage signal in a case where the weld diagnosis is performed. FIG. 6 illustrates, in order from a top, a waveform of the voltage signal received from the first connection point P1 in a case where the relay SW1 is welded, a waveform of the voltage signal in a case where the relay SW1 is not welded, a timing to turn on/off the relay SW1 and a timing to sample the voltage signal. A horizontal axis of FIG. 6 represents time.

Moreover, FIG. 7 illustrates, in order from a top, a waveform of the voltage signal in a case where the weld diagnosis is performed again, a timing to turn on/off the relay SW1 and a timing to sample the voltage signal. A horizontal axis of FIG. 7 represents time. Here, a case in which the square wave outputting part 11 outputs a square wave of which one cycle is 500 ms (250 ms each for a high period and for a low period) is taken as an example.

As shown in FIG. 5, in a case where the electrical leakage detection apparatus 1 performs the weld diagnosis for the relay SW1, the square wave outputting part 11 first outputs the square-wave voltage signal to the diagnosis circuit 20. At this time, the relay SW1 is in the OFF-state.

Thus, the voltage signal input to the diagnosis circuit 20 flows into the weld diagnosis part 12 through the first buffer B1, the detection resistor R1, the first connection point P1 and the second buffer B2, as shown by a heavy sold arrow line in FIG. 5.

As described above, in the diagnosis circuit 20, the voltage signal is input to the weld diagnosis part 12 through the second buffer B2 so that it is possible to prevent the voltage signal input to the weld diagnosis part 12 from causing an adverse effect due to internal impedance of the processor 10, on the electrical leakage diagnosis performed by the electrical leakage diagnosis part 14.

Then, the relay driving part 16 causes the relay switch SW2 to be on to cause the relay SW1 to be in the ON-state from the OFF-state. Thus, a voltage signal path shown by a heavy dotted arrow line in FIG. 5 is formed in the diagnosis circuit 20 if the relay SW1 is not welded in an open state (OFF-welded).

In other words, in addition to the voltage signal path shown by the heavy solid arrow line in FIG. 5, a voltage signal path reaching the low-voltage side ground LGND through the first connection point P1, the first coupling capacitor C1, the second connection point P2, the relay SW1 and the stray capacitance C3, is formed as shown by the heavy dotted arrow line in FIG. 5.

Thus, in a case where the relay SW1 is not in the OFF-welded state, once the relay SW1 is changed to the ON-state from the OFF-state, the voltage value of the voltage signal at the first connection point P1 momentarily drops in a time period in which the stray capacitance C3 is charged.

On the other hand, in a case where the relay SW1 is in the OFF-welded state, the relay SW1 is not changed from the OFF-state to the ON-state so that the voltage value of the voltage signal at the first connection point P1 does not decrease because the stray capacitance C3 is not charged.

Therefore, the weld diagnosis part 12 samples the peak value of the voltage of the voltage signal beforehand, and calculates and stores an average value of the peak values as a reference electric potential. Then, in a case where the voltage value of the input voltage signal does not fall below the reference electric potential in a time period from a time point at which the relay SW1 becomes the ON-state to a time point at which the relay SW1 becomes the OFF-state, the weld diagnosis part 12 diagnoses that the relay SW1 is welded. In a case where the voltage value of the input voltage signal falls below the reference electric potential, the weld diagnosis part 12 determines that the relay SW is not welded.

However, if the relay SW1 becomes the ON-state from the OFF-state at a same time as a rise of the voltage signal, accuracy of the weld diagnosis performed by the weld diagnosis part 12 decreases. Specifically, as shown in FIG. 6, the waveform of the voltage signal is not completely square due to characteristics of the diagnosis circuit 20. The voltage value of the voltage signal gradually increases from a time point of the rise of the voltage signal, and then reaches the peak value.

Therefore, in a case where the weld diagnosis is started once the weld diagnosis part 12 becomes the ON-state at a same time as the rise of the voltage signal, there is a possibility that the weld diagnosis part 12 detects a voltage value below the reference electric potential before the voltage value of the voltage signal reaches the peak value, and wrongly determines that the relay SW1 is welded.

When the weld diagnosis is performed, the relay driving part 16 causes the relay SW1 to be in the ON-state from the OFF-state at a time point t2 in FIG. 6 after a predetermined time period (here, 140 ms) that the voltage signal needs to sufficiently reach the peak value from a time point t0 at which the voltage signal starts rising.

Then, the weld diagnosis part 12 calculates and stores the average value of the peak values sampled in the time period (here, a 10 ms-time period from a time point t1 to the time point t2) immediately before the relay SW1 becomes the ON-state, as the reference electric potential.

Then, the weld diagnosis part 12 performs the weld diagnosis for the relay SW1 in the time period from the time point at which the relay SW1 becomes the ON-state to a time point at which the relay SW1 becomes the OFF-state. At that time, the voltage signal has already reached the peak value. Thus, the weld diagnosis part 12 accurately diagnoses whether the relay SW1 is in the OFF-welded.

The weld diagnosis part 12 can also diagnose whether or not the relay SW1 is welded in a closed state (ON-welded) by an operation similar to the operation described above.

Specifically, in a case where the relay SW1 is in the ON-welded state, the stray capacitance C3 is maintained fully charged because the square voltage signal is input to the diagnosis circuit 20 from the square wave outputting part 11 so that the stray capacitance C3 is sequentially charged at a voltage corresponding to the square wave before discharging naturally.

Thus, the voltage value of the voltage signal at the first connection point P1 does not decrease even if the relay driving part 16 performs a switching operation for causing the relay SW1 to be in the ON-state from the OFF-state. On the other hand, in a case where the relay SW1 is not in the ON-welded state, if the relay driving part 16 performs the switching operation for causing the relay SW1 to be in the ON-state from the OFF-state, the voltage value of the voltage signal at the first connection point P1 decreases because the stray capacitance C3 is charged.

Thus, when the weld diagnosis part 12 performs the switching operation for causing the relay SW1 to be in the On-state from the OFF-state, in a case where the voltage value of the input voltage signal does not fall below the reference electric potential, the weld diagnosis part 12 diagnoses that the relay SW1 is in the ON-welded state, and in a case where the voltage value of the input voltage signal falls below the reference electric potential, the weld diagnosis part 12 diagnoses that the relay SW1 is not in the ON-welded state.

As described above, the weld diagnosis part 12 cannot determine which state the relay SW1 is in, the OFF-welded state or the ON-welded state. However, the weld diagnosis part 12 can diagnose whether or not the relay SW1 is in one of the OFF-welded state and the ON-welded state. Once the weld diagnosis part 12 ends the weld diagnosis, the noticing part, not illustrated, reports a diagnosis result. Then, the relay driving part 16 causes the relay SW1 to be in the OFF-state at a time point t3 from the ON-state.

Moreover, the weld diagnosis part 12 improves accuracy of the weld diagnosis by repeating the weld diagnosis described above. Here described will be an example of an operation of the weld diagnosis repeatedly performed by the weld diagnosis part 12, with reference to FIG. 7.

As shown in FIG. 7, a case will be described in which the voltage signal input to the weld diagnosis part 12 rises at a time point t0, and falls at a time point t3, 250 ms after the time point t0, and then the voltage signal rises again at a time point t4, 250 ms after the time point t3. In other words, a case in which one cycle of the voltage signal is 500 ms will be described.

In the case, the weld diagnosis part 12 ends a sampling for a first weld diagnosis at the time point t3. Then, if the weld diagnosis part 12 performs another sampling for a second weld diagnosis, for example, in a time period in which the voltage signal is rising (within 250 ms after the time point t4), the accuracy of the weld diagnosis decreases.

Specifically, in a case where a time interval between the first weld diagnosis and the second weld diagnosis is less than one second, the weld diagnosis part 12 cannot accurately perform the weld diagnosis because the stray capacitance C3 does not end natural discharge before the second weld diagnosis is started.

Therefore, the weld diagnosis part 12 performs the sampling for the second weld diagnosis later than a time point t5 that is one second (1000 ms) after the time point t4 at which the voltage signal next starts rising after the first weld diagnosis. Thus, at a time point at which the weld diagnosis part 12 starts the second weld diagnosis, the stray capacitance C3 has already ended natural discharge so that the weld diagnosis part 12 performs the weld diagnosis accurately.

Figure 8:
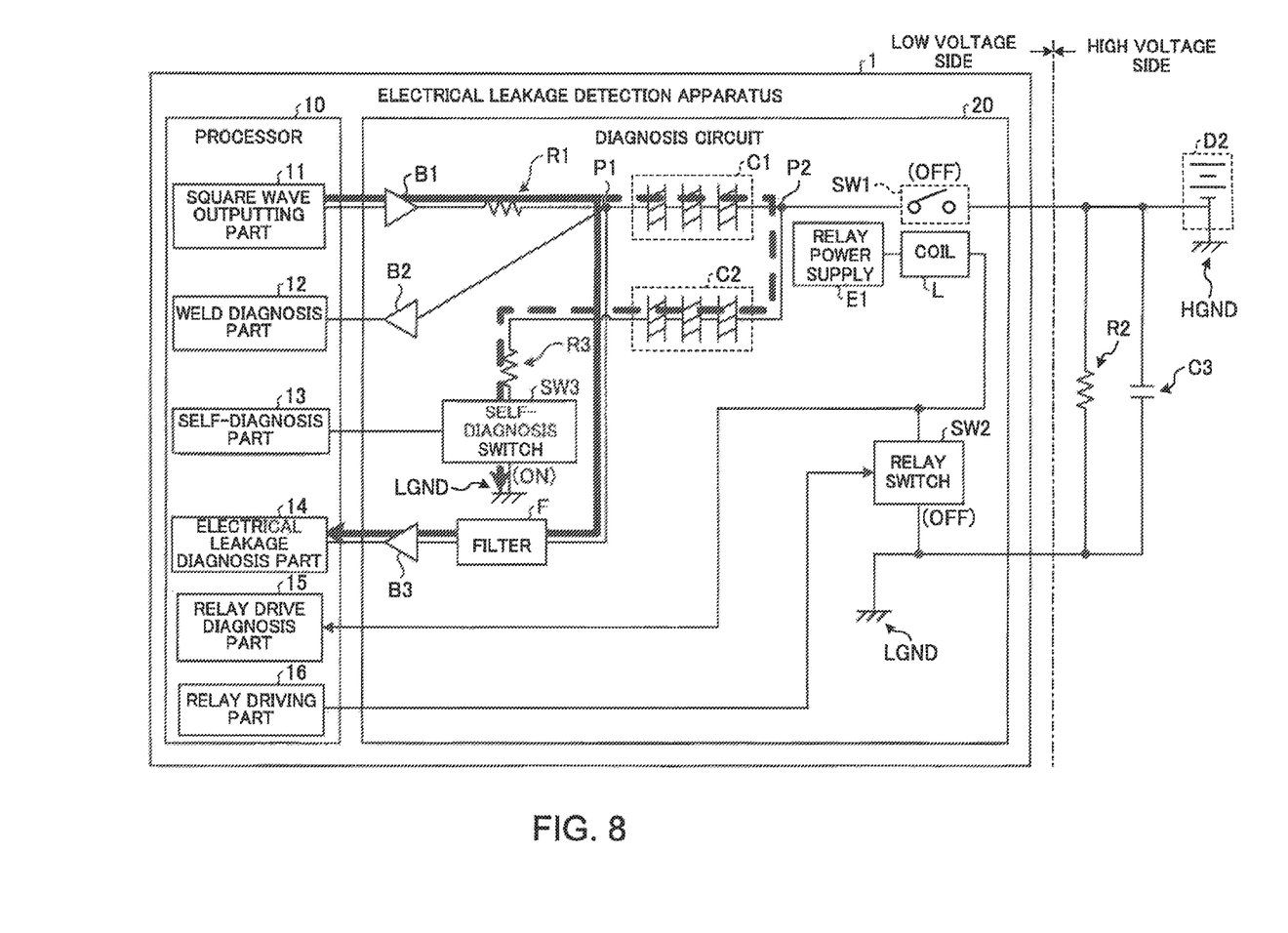
FIG. 8 illustrates an operation of the electrical leakage detection apparatus of the embodiment.

Next described will be an operation of the self-diagnosis performed by the electrical leakage detection apparatus 1 with reference to FIG. 8. FIG. 8 illustrates a flow of the voltage signal at the self-diagnosis. As shown in FIG. 8, the electrical leakage detection apparatus 1 performs the self-diagnosis, having the relay SW1 in the OFF-state.

Moreover, when the electrical leakage detection apparatus 1 performs the self-diagnosis, the self-diagnosis part 13 causes the self-diagnosis switch SW3 to be in the ON-state from the OFF-state. Then, the square wave outputting part 11 outputs the square voltage signal to the diagnosis circuit 20.

The voltage signal to be input to the diagnosis circuit 20 is input into the electrical leakage diagnosis part 14 through the first buffer B1, the detection resistor R1, the first connection point P1, the filter F and the third buffer B3, as shown by a heavy solid arrow line in FIG. 8.

At this time, a voltage signal path reaching the low-voltage side ground LGND through the first buffer B1, the detection resistor R1, the first connection point P1, the first coupling capacitor C1, the second connection point P2, the second coupling capacitor C2, the simulation insulation resistor R3 and the self-diagnosis switch SW3, is also formed in the diagnosis circuit 20.

Here, as described above, the resistance value having an insulation performance substantially equivalent to the ground insulation resistance R2 of the secondary battery D2 to be measured in the case where no DC leakage exists from the secondary battery D2 is set for the simulation insulation resistor R3. Therefore, the flow of the voltage signal shown by a heavy dotted arrow line in FIG. 8 is a flow imitating the voltage signal shown by the heavy dotted arrow line in FIG. 3 in the case where no electrical leakage exists from the secondary battery D2.

The electrical leakage diagnosis part 14 samples the input voltage signal to detect the peak value of the voltage of the voltage signal. The electrical leakage diagnosis part 14 compares the detected peak value with the electrical leakage determination threshold value that is used for the electrical leakage diagnosis. Then, in a case where the detected peak value is equal to or greater than the electrical leakage determination threshold value, the electrical leakage diagnosis part 14 diagnoses that the electrical leakage diagnosis function of the electrical leakage detection apparatus 1 is normal. In a case where the detected peak value is smaller than the electrical leakage determination threshold value, the electrical leakage diagnosis part 14 diagnoses that the electrical leakage diagnosis function has a problem.

Figure 9:
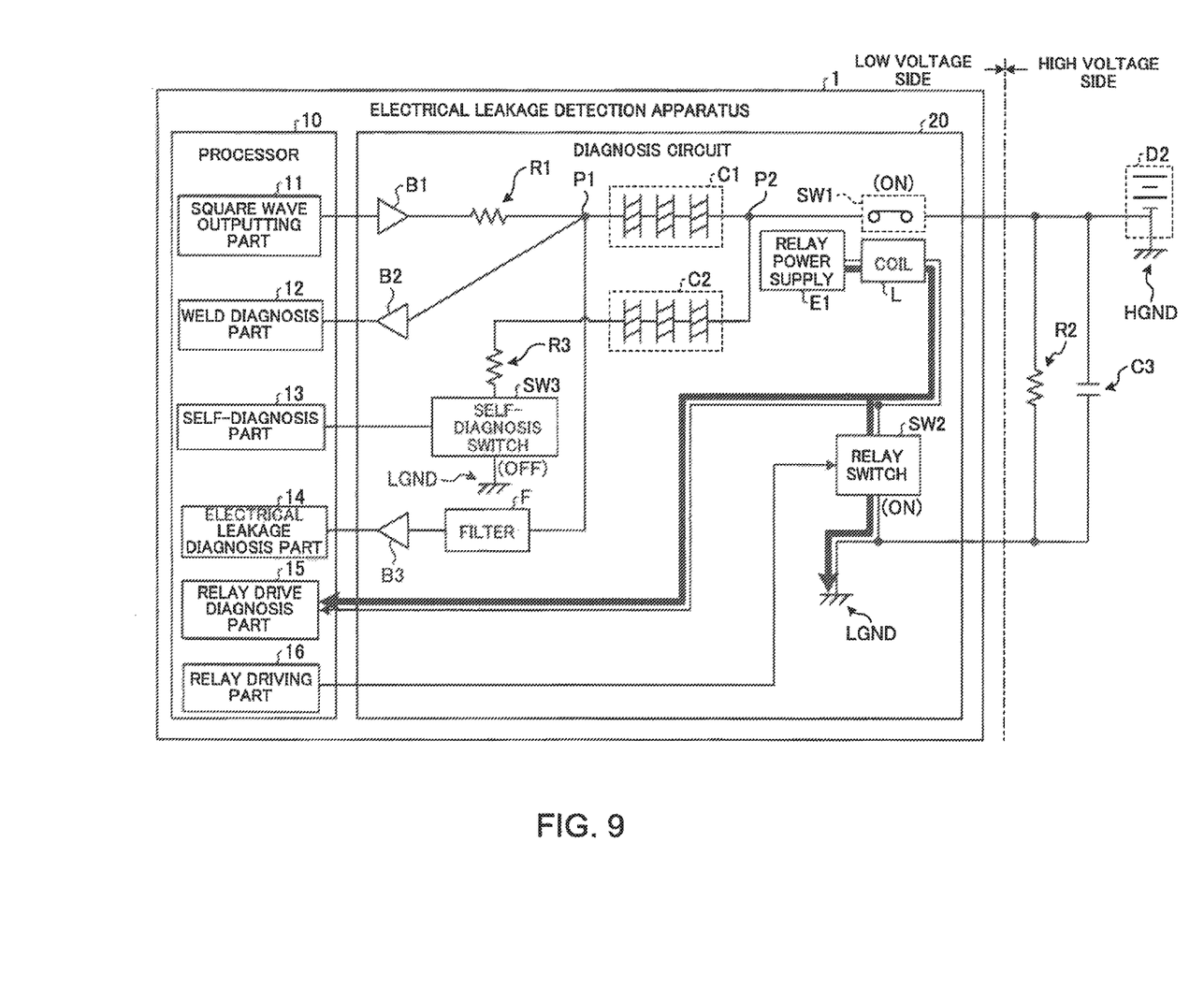
FIG. 9 illustrates an operation of the electrical leakage detection apparatus of the embodiment.

Next described will be an operation of the electrical leakage detection apparatus 1 to perform an operation diagnosis for a relay driving circuit, with reference to FIG. 9. FIG. 9 illustrates a flow of the voltage signal at the operation diagnosis for the relay driving circuit. As shown in FIG. 9, in a case where the electrical leakage detection apparatus 1 performs the operation diagnosis for the relay driving circuit, the relay driving part 16 causes the relay switch SW2 to be in the ON-state from the OFF-state.

Thus, in a case where the relay driving circuit has no problem, a current flow from the relay power source E1 to the relay drive diagnosis part 15 through the coil L is formed in the diagnosis circuit 20, and, simultaneously, a current flow from the coil L to the low-voltage side ground LGND through the relay switch SW2 is formed in the diagnosis circuit 20. On the other hand, in a case where the relay driving circuit has a problem, the current flow is not formed.

Therefore, in a case where the relay driving part 16 causes the relay switch SW2 to be in the ON-state from the OFF-state, if the relay drive diagnosis part 15 detects the current from the coil L, the relay drive diagnosis part 15 diagnoses that the relay driving circuit has no problem, and if the relay drive diagnosis part 15 does not detect the current from the coil L, the relay drive diagnosis part 15 diagnoses that the relay driving circuit has a problem.

As described above, the electrical leakage detection apparatus of this embodiment includes the electrical leakage diagnosis part and the relay. The electrical leakage diagnosis part performs the electrical leakage diagnosis to determine whether or not a DC leakage exists from the secondary battery that receives and provides electricity from/to the AC power system including the electrical leakage detector that detects an AC leakage of the AC power supplied from the utility power source. The relay disconnectably connects the secondary battery to the electrical leakage diagnosis part.

Thus, since the electrical leakage detection apparatus causes the relay to be in the OFF-state while the electrical leakage diagnosis is not performed so as to disconnect the secondary battery from the electrical leakage diagnosis part, it is possible to reduce occurrence of a problem caused by interference of a high voltage noise while the electrical leakage diagnosis is not performed.

The foregoing embodiment describes, as an example, the case of detecting whether an electrical leakage exists from the secondary batter provided to a house. However, the electrical leakage detection apparatus of the embodiment is not limited to the example. The electrical leakage detection apparatus of the embodiment can detect an electrical leakage from a secondary battery provided to an electric vehicle, a hybrid vehicle and devices other than a house.

More effects and modifications of the embodiment can be easily derived by a person skilled in the art. Thus, broader aspects of the invention are not limited by the specific details and the representative embodiment described above. Therefore, various modifications are possible without departing from the comprehensive concept and spirit of the invention defined in the attached claims and equivalents thereof.

While the invention has been shown and described in detail, the foregoing description is in all aspects illustrative and not restrictive. It is therefore understood that numerous other modifications and variations can be devised without departing from the scope of the invention.

What is claimed is:

1. An electrical leakage detection apparatus comprising:
    a microcomputer configured to perform an electrical leakage diagnosis to determine whether or not a direct-current leakage exists from a secondary battery that provides and receives electricity to/from an alternating-current power system that includes an electrical leakage detector that detects an alternating-current leakage of alternating-current power supplied from a utility power source; and
    a relay that disconnectably connects the microcomputer with the secondary battery, wherein
    the microcomputer causes the relay (i) to be in an ON-state in a case where the electrical leakage diagnosis is performed and (ii) to be in an OFF-state while the electrical leakage diagnosis is not performed, so that the relay disconnects the microcomputer from the secondary battery while the electrical leakage diagnosis is not performed.

2. The electrical leakage detection apparatus according to claim 1, further comprising:
    a detection resistor and a coupling capacitor through which the microcomputer outputs a square wave to the secondary battery; and
    a filter that removes noise from a voltage signal that is output from a connection point between the detection resistor and the coupling capacitor, wherein
    the microcomputer performs a weld diagnosis to determine whether or not the relay is welded in one of the ON-state and the OFF-state,
    the microcomputer performs the electrical leakage diagnosis based on the voltage signal received from the connection point through the filter, and
    the microcomputer performs the weld diagnosis based on the voltage signal received from the connection point not through the filter.

3. The electrical leakage detection apparatus according to claim 2, wherein
    the microcomputer causes the relay (i) to be in the ON-state after a predetermined time period passes from a time point at which the voltage signal starts rising and (ii) to be in the OFF-state at a time point at which the voltage signal starts falling, the voltage signal being received from the connection point not through the filter; and
    the microcomputer performs the weld diagnosis in a time period in which the relay is in the ON-state.

4. The electrical leakage detection apparatus according to claim 3, wherein
    the microcomputer performs the weld diagnosis based on (i) the voltage signal that is received from the connection point not through the filter in a time period immediately before the relay is caused to be in the ON-state and (ii) the voltage signal that is received from the connection point not through the filter in a time period from a time point at which the relay is caused to be in the ON-state to a time point at which the relay is caused to be in the OFF-state.

5. An electrical leakage detection system comprising:
    a secondary battery that provides and receives electricity to/from an alternating-current power system that includes an electrical leakage detector that detects an alternating-current leakage of alternating-current power supplied from a utility power source;
    a microcomputer configured to perform an electrical leakage diagnosis to determine whether or not a direct-current leakage exists from the secondary battery; and
    a relay that disconnectably connects the secondary battery with the microcomputer.

6. The electrical leakage detection system according to claim 5, wherein
    the microcomputer causes the relay (i) to be in an ON-state in a case where the electrical leakage diagnosis is performed and (ii) to be in an OFF-state while the electrical leakage diagnosis is not performed, so that the relay disconnects the microcomputer from the secondary battery while the electrical leakage diagnosis is not performed.

7. The electrical leakage detection system according to claim 6, further comprising:
a detection resistor and a coupling capacitor through which the microcomputer outputs a square wave; and
a filter that removes noise from a voltage signal that is output from a connection point between the detection resistor and the coupling capacitor, wherein
the microcomputer performs a weld diagnosis to determine whether or not the relay is welded in one of the ON-state and the OFF-state,
the microcomputer performs the electrical leakage diagnosis based on the voltage signal received from the connection point through the filter, and
the microcomputer performs the weld diagnosis based on the voltage signal received from the connection point not through the filter.

8. The electrical leakage detection system according to claim 7, wherein
the microcomputer causes the relay (i) to be in the ON-state after a predetermined time period passes from a time point at which the voltage signal starts rising and (ii) to be in the OFF-state at a time point at which the voltage signal starts falling, the voltage signal being received from the connection point not through the filter; and
the microcomputer performs the weld diagnosis in a time period in which the relay is in the ON-state.

9. The electrical leakage detection system according to claim 8, wherein
the microcomputer performs the weld diagnosis based on (i) the voltage signal that is received from the connection point not through the filter in a time period immediately before the relay is caused to be in the ON-state and (ii) the voltage signal that is received from the connection point not through the filter in a time period from a time point at which the relay is caused to be in the ON-state to a time point at which the relay is caused to be in the OFF-state.

10. The electrical leakage detection apparatus according to claim 1, wherein
the microcomputer performs the electrical leakage diagnosis based on a voltage signal received from a diagnosis circuit, and
the relay disconnectably connects the microcomputer and the diagnosis circuit with the secondary battery.

11. The electrical leakage detection apparatus according to claim 1, further comprising:
a diagnosis circuit, wherein
the microcomputer is coupled to the diagnosis circuit and performs the electrical leakage diagnosis based on a voltage signal received from the diagnosis circuit, and
the relay disconnectably connects the microcomputer and the diagnosis circuit with the secondary battery.

12. The electrical leakage detection apparatus according to claim 1, further comprising:
a diagnosis circuit, wherein
the microcomputer is coupled to the diagnosis circuit and performs the electrical leakage diagnosis by comparing a voltage signal received from the diagnosis circuit to a threshold, and
the relay disconnectably connects the microcomputer and the diagnosis circuit with the secondary battery.

* * * * *